United States Patent
Main et al.

(10) Patent No.: US 9,620,226 B1
(45) Date of Patent: Apr. 11, 2017

(54) DATA RETENTION CHARGE LOSS AND READ DISTURB COMPENSATION IN SOLID-STATE DATA STORAGE SYSTEMS

(71) Applicant: Western Digital Technologies, Inc., Irvine, CA (US)

(72) Inventors: Dale Charles Main, La Canada-Flintridge, CA (US); Abhilash Ravi Kashyap, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 14/929,080

(22) Filed: Oct. 30, 2015

(51) Int. Cl.
  *G11C 11/34* (2006.01)
  *G11C 16/14* (2006.01)
  *G11C 16/08* (2006.01)
  *G11C 16/26* (2006.01)
  *G11C 16/34* (2006.01)

(52) U.S. Cl.
  CPC .............. *G11C 16/14* (2013.01); *G11C 16/08* (2013.01); *G11C 16/26* (2013.01); *G11C 16/3427* (2013.01)

(58) Field of Classification Search
  CPC ......... G11C 16/14; G11C 16/08; G11C 16/26; G11C 16/3427
  See application file for complete search history.

(56) References Cited

U.S. PATENT DOCUMENTS

| | | |
|---|---|---|
| 6,219,276 B1 | 4/2001 | Parker |
| 6,856,556 B1 | 2/2005 | Hajeck |
| 7,126,857 B2 | 10/2006 | Hajeck |
| 7,173,859 B2 | 2/2007 | Hemink |
| 7,430,136 B2 | 9/2008 | Merry, Jr. et al. |
| 7,447,807 B1 | 11/2008 | Merry et al. |
| 7,489,543 B1 | 2/2009 | Lee |
| 7,502,256 B2 | 3/2009 | Merry, Jr. et al. |
| 7,509,441 B1 | 3/2009 | Merry et al. |
| 7,596,643 B2 | 9/2009 | Merry, Jr. et al. |
| 7,653,778 B2 | 1/2010 | Merry, Jr. et al. |
| 7,685,337 B2 | 3/2010 | Merry, Jr. et al. |

(Continued)

OTHER PUBLICATIONS

International Search Report dated Jan. 26, 2017 for PCT/US2016/059454.
Written Opinion dated Jan. 26, 2017 for PCT/US2016/059454.

*Primary Examiner* — Richard Elms
*Assistant Examiner* — Mohammed A Bashar
(74) *Attorney, Agent, or Firm* — Chang & Hale LLP

(57) ABSTRACT

A data storage device includes a solid-state memory including memory cells and a controller configured to perform a first programming scheme that programs a first subset of the cells to a first voltage state using a first target voltage, programs a second subset to a second voltage state using a second target voltage higher than the first target voltage, programs a third subset to a third voltage state using a third target voltage higher than the second target voltage, and programs a fourth subset to a fourth voltage state using a fourth target voltage higher than the third target voltage. A difference in voltage between the fourth target voltage and the third target voltage may be greater or less than a difference in voltage between the third target voltage and the second target voltage and/or a difference in voltage between the second target voltage and the first target voltage.

21 Claims, 10 Drawing Sheets

(56) References Cited

U.S. PATENT DOCUMENTS

| | | |
|---|---|---|
| 7,685,338 B2 | 3/2010 | Merry, Jr. et al. |
| 7,685,374 B2 | 3/2010 | Diggs et al. |
| 7,733,712 B1 | 6/2010 | Walston et al. |
| 7,765,373 B1 | 7/2010 | Merry et al. |
| 7,898,855 B2 | 3/2011 | Merry, Jr. et al. |
| 7,912,991 B1 | 3/2011 | Merry et al. |
| 7,936,603 B2 | 5/2011 | Merry, Jr. et al. |
| 7,962,792 B2 | 6/2011 | Diggs et al. |
| 8,078,918 B2 | 12/2011 | Diggs et al. |
| 8,090,899 B1 | 1/2012 | Syu |
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,166,245 B2 | 4/2012 | Diggs et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,331,145 B2 | 12/2012 | Kang |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 8,879,320 B2 | 11/2014 | Lee |
| 9,013,920 B2 | 4/2015 | Stoev et al. |
| 2010/0174849 A1 | 7/2010 | Walston et al. |
| 2010/0250793 A1 | 9/2010 | Syu |
| 2011/0099323 A1 | 4/2011 | Syu |
| 2011/0131444 A1 | 6/2011 | Buch et al. |
| 2011/0145663 A1 | 6/2011 | Kong et al. |
| 2011/0283049 A1 | 11/2011 | Kang et al. |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 | 12/2012 | Strange et al. |
| 2013/0132638 A1 | 5/2013 | Horn et al. |
| 2013/0135937 A1* | 5/2013 | Sakui .............. G11C 11/5628 365/185.19 |
| 2013/0145106 A1 | 6/2013 | Kan |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |
| 2015/0228348 A1* | 8/2015 | Lee ................ G11C 16/3459 365/185.11 |

* cited by examiner

DATA RETENTION CHARGE LOSS AND READ DISTURB COMPENSATION IN SOLID-STATE DATA STORAGE SYSTEMS

BACKGROUND

Field

This disclosure relates to data storage systems. More particularly, the disclosure relates to systems and methods for programming and reading data in solid-state memory devices.

Description of Related Art

Certain solid-state memory devices, such as flash drives, store information in an array of memory cells constructed with floating gate transistors. Integrity of solid-state memory cells can be affected by various factors. How data is programmed and read can have an effect on whether programmed data can be successfully interpreted when read-back at a later time.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

DETAILED DESCRIPTION

Figure 1:
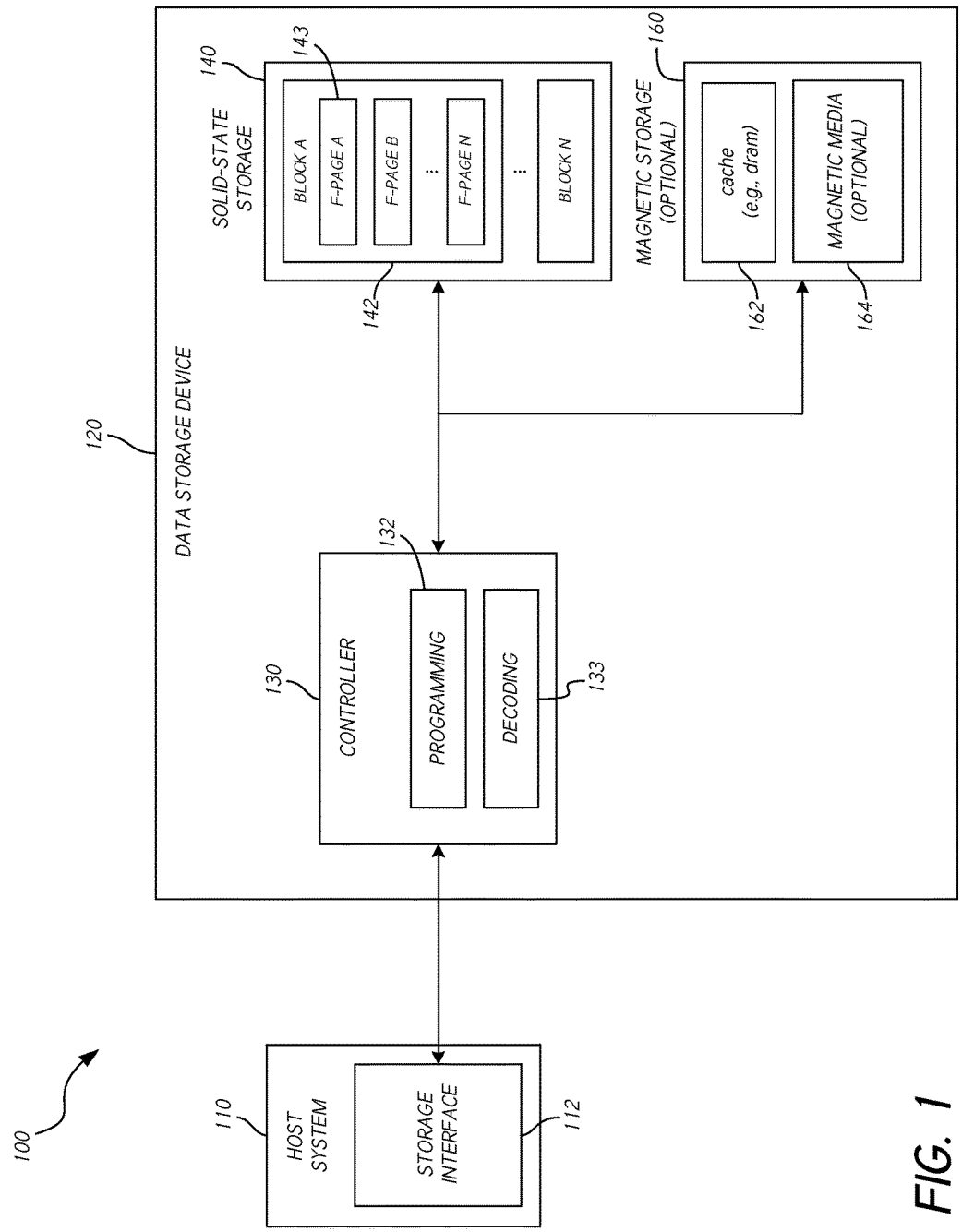
FIG. 1 is a block diagram of a data storage system including a non-volatile memory array according to an embodiment.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

The headings provided herein are for convenience only and do not necessarily affect the scope or meaning of the claims. Disclosed herein are example configurations and embodiments relating to data retention charge loss and read disturb compensation in solid-state memory.

As used in this application, "solid-state memory," "non-volatile solid-state memory," "non-volatile memory," "NVM," or variations thereof may refer to solid-state memory such as NAND flash. However, the systems and methods of this disclosure may also be useful in more conventional hard drives and hybrid drives (or any data storage devices) including both solid-state and hard drive components. Solid-state memory may comprise a wide variety of technologies, such as flash integrated circuits, Phase Change Memory (PC-RAM or PRAM), Programmable Metallization Cell Random Access Memory (RAM) (PMC-RAM or PMCm), Ovonic Unified Memory (OUM), Resistance RAM (RRAM), NAND memory, NOR memory, EEPROM, Ferroelectric RAM (FeRAM), Magnetoresistive RAM (MRAM), or other discrete NVM (non-volatile solid-state memory) chips. The non-volatile solid-state memory arrays or storage devices may be physically divided into planes, blocks, pages, and sectors, as is known in the art. Other forms of storage (e.g., battery backed-up volatile DRAM or SRAM devices, magnetic disk drives, etc.) may additionally or alternatively be used.

Overview

The present disclosure provides systems and methods for encoding data for programming in data storage devices and/or solid-state memory devices, and further for decoding such data. Although certain embodiments are disclosed herein in the context of NAND flash memory devices/systems, it should be understood that the principles disclosed herein may be applicable in connection with any type of solid-state memory, whether volatile or non-volatile.

NAND flash memories, and other non-volatile solid-state memory devices, are widely used in solid-state data storage devices. In certain solid-state memory devices/systems, the ability to correctly decode data written to solid-state memory cells may be adversely affected by retention-related charge loss and/or read disturb charge gain. For example, in prolonged storage applications, lack of data retention can lead to decoding failure. Furthermore, in relatively high-read utilization use cases, read disturb may lead to decoding failures. "Data retention," as used herein, may be understood according to its broad and/ordinary meaning and may refer to the ability to recover data programmed in solid-state memory after a period of time. "Data retention period" may be used to refer to the period of time itself over which data may be stored in solid-state memory. "Retention related effects" may be used to refer to the loss or migration of charge in a programmed cell due to the passing of time, temperature, and/or other factors.

Data retention is a measure of how long a solid-state memory cell can hold voltage, and therefor maintain its programmed state. Data loss due to charge loss may occur when a memory cell is programmed and subsequently inactive for a prolonged period of time, particularly at elevated temperature. Such charge loss may generally be attributable to the dielectric associated with the solid-state memory cell being inherently leaky and at least somewhat prone to allowing electrons to escape the charge trap of the cell. Data retention charge loss may occur increasingly as the programming target voltage increases.

Data retention characteristics, along with endurance characteristics, may represent significant specification metrics for certain solid-state memory products. With regard to endurance, solid-state storage devices generally have limited endurance, which may be characterized by a number of terabytes (TB) per year of write data, which may be specified as a warranty condition by the device manufacturer. Because endurance and data retention may generally be considered to have a substantially inverse relationship, heavily-cycled blocks may have relatively shorter retention compared to similar lightly-cycled blocks. As a solid-state memory device is cycled, it may lose its data retention capabilities, thereby resulting in data loss. Based on the inverse relationship between data retention and endurance, where gains in data retention performance can be achieved, such gains may be substituted at least in part for improved endurance in certain situations.

Various mechanisms may be implemented to improve data retention characteristics. For example, reducing program/erase (P/E) cycles on blocks, increasing relaxation periods between cycles, as well as other mechanisms. However, implementation of such mechanisms may result in lower device performance.

Generally, read disturb errors may be due at least in part to charge gain, wherein charge is added to cells during a read of the cell itself or neighboring cell(s), thereby causing the cell charge level to migrate from one voltage level/state to the next higher voltage state. The cells with the lowest voltage level(s) may tend to gain charge faster than cells at higher voltage levels due at least in part to the relatively lower voltage across the dielectric of such cells. Because of this, cells in the lowest voltage state (e.g., an 'erase,' or 'E,' state) may be impacted the most by read disturb. As an example, data stored in data centers can be particularly prone to experiencing read disturb and/or data retention charge migration or loss due to the "write-once-read-many" nature of the data in certain data center applications.

As used herein, multi-level cell (MLC) programming refers to any programming scheme where cells are encoded with two or more levels of programming (each cell representing two bits or more). Although two-bit or two-level MLC examples will be used throughout this disclosure, the various embodiments described and shown are applicable to any MLC scheme of any number of levels. Certain embodiments disclosed herein provide for systems and methods for improving read disturb and/or data retention performance in solid-state memory devices through the use of variable program voltage target level(s) and/or read threshold level(s). For example, with respect to two-bit or two-level MLC programming, by moving program voltage targets up for A, B and/or C states (described in greater detail below), improved read disturb performance may be achieved using an increased A read voltage threshold in certain implementations. Furthermore, in certain implementations, by moving program targets down for A and B states, improved data retention performance may be achieved using a decreased C read voltage threshold. Additionally, in certain implementations, both improved read disturb performance and improved data retention performance may be achieved by moving the program target up for the A state and down for the B state and using an increased A read voltage threshold and a decreased C read voltage threshold.

Data Storage System/Device

FIG. 1 illustrates a system 100 including a host system 110 and a data storage device 120 that implements data retention charge loss compensation and/or read disturb compensation programming/reading according to one or more embodiments disclosed herein. As is shown, the data storage device 120 (e.g., solid-state hybrid drive, solid-state drive, etc.) includes a controller 130 and a non-volatile memory array (e.g., solid-state storage) 140. The non-volatile memory array 140 may include a plurality of chips, or dies, each comprising one or more blocks of storage. Each block may comprise a plurality of flash pages (F-pages).

In certain embodiments, the data storage device 120 may be a solid-state hybrid disk drive including a magnetic storage module 160, which may comprise magnetic media 164 (e.g., one or more magnetic disks). The data storage device 120 may be in a card-based form factor such as a PCIe or NVMe type storage device. The solid-state storage 140 may comprise any desirable type of solid-state memory.

The controller 130 can be configured to receive data and/or storage access commands from a storage interface module 112 (e.g., a device driver) of the host system 110. Storage access commands communicated by the storage interface module 112 can include write data and read data commands issued by the host system 110. Read and write commands can specify a logical address (e.g., logical block addresses, or "LBAs") used to access the data storage device 120. The controller 130 can execute the received commands in the solid-state storage 140 and/or magnetic storage device 160. To facilitate storage of host data, the controller 130 can implement a logical interface. The logical interface can present to the host system 110 data storage system memory as a set of logical addresses (e.g., contiguous address) where user data can be stored. Internally, the controller 130 may map logical addresses to various physical locations or addresses in the solid-state storage 140 and/or other storage modules.

The programming module 132 of the controller 130 may implement a desirable programming scheme suitable for the solid-state storage 140. In certain embodiments, the programming module 132 and/or solid-state storage 140 may be configured to implement an MLC programming scheme in which cells of solid-state memory are programmed to store a charge level representative of two or more bits of data. Such a programming scheme is described below with reference to FIG. 2. In certain embodiments, the programming module 132 may be configured to implement data retention compensation programming and/or read disturb compensation programming, as described herein. The controller 130 further includes a decoding module 133, which may implement a decoding scheme that corresponds to the programming scheme implemented by the programming module 132. In certain embodiments, the decoding module 133 may be configured to implement data retention compensation decoding and/or read disturb compensation decoding, as described herein. While FIG. 1 depicts a generic controller 130 within a storage device, in one or more embodiments, some or all of the described components/functionalities of the controller 130 may be implemented as part of a storage device level controller (e.g., a SSD controller), a memory level controller (e.g., a NAND controller), or a combination of both.

Figure 2:
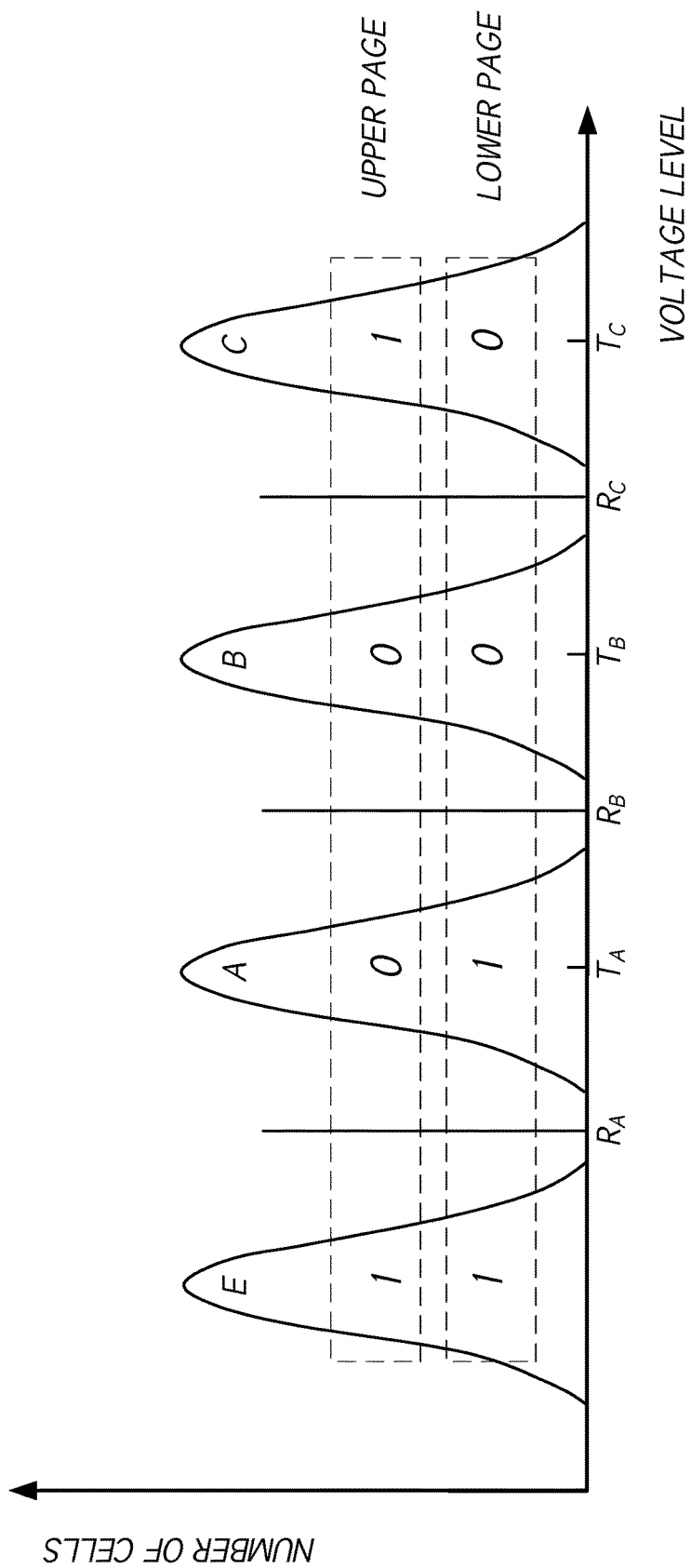
FIG. 2 is a graph showing a probability distribution of cells in a non-volatile memory array according to one or more embodiments.

FIG. 2 shows an example two-level (two-bit) MLC solid-state memory programming scheme comprising four programming states: an erased state (E), and three programmed states (A, B, C), wherein each state represents two bits of data. Although two-level (two-bit) MLC programming is described herein in connection with certain embodiments, it should be understood that the principles disclosed herein may be applicable in other programming schemes, such as triple-level cell (TLC), or other programming scheme. With further reference to FIG. 2, in certain embodiments, the programming states each comprise a most-significant bit, referred to as the "upper page," and a least-significant bit, referred to as the "lower page." While particular coding values are assigned to the various states of the distribution (e.g., '11' for E, '01' for A, '00' for B, and '10' for C), other coding schemes may also be used within the scope of the present disclosure.

In decoding memory cells, one or more reference voltage levels, referred to herein as "voltage read levels," or "read threshold levels," may be used to read the cells to determine what charge state the cells belong to. FIG. 2 illustrates three voltage read levels, $R_A$, $R_B$ and $R_C$. In certain embodiments, lower page values may be determined based on a read at $R_B$, while upper page values may be obtained by reading at $R_B$, and subsequently at $R_A$ and/or $R_C$.

As shown in FIG. 2, in certain solid-state storage systems, data programming levels may be substantially evenly distributed, such that margins between the various voltage states are substantially equal. However, even separation of voltage states may result in undesirable numbers of cells crossing over read thresholds resulting in bit errors due to data retention charge loss and/or read disturb. Therefore, certain embodiments disclosed herein provide a method to adjust both program voltage targets (e.g., $T_A$, $T_B$, $T_C$) and read voltage thresholds in order to favor read disturb performance, data retention performance, or both.

Data Retention Charge Loss Compensation

Figure 3:
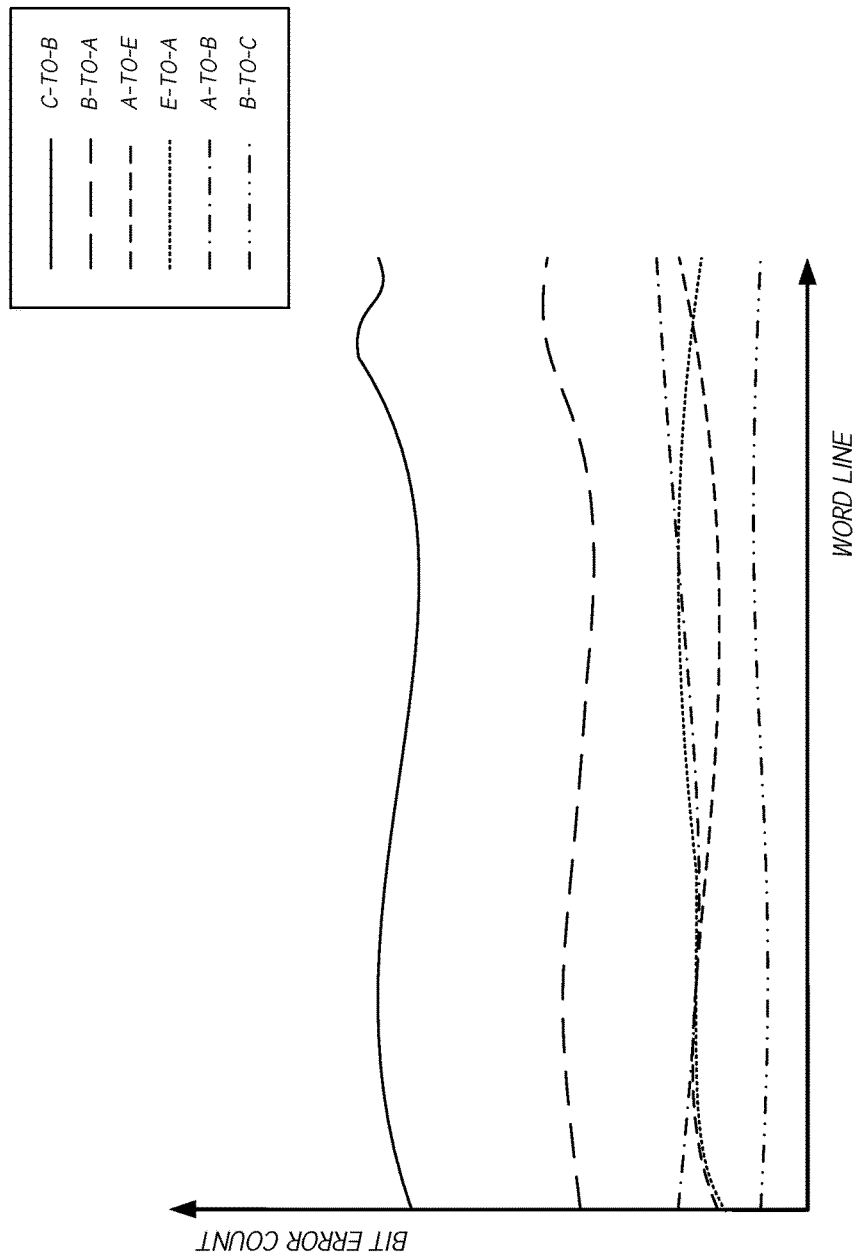
FIG. 3 is a graph showing state-to-state transition errors in a solid-state memory device due to data retention charge loss according to one or more embodiments.

Over a data retention time period, charge loss in solid-state memory cells can cause the states of a voltage distribution to widen and overlap voltage read levels. Generally, the higher a cell's programmed voltage, the greater the data retention charge loss experienced by the cell. Therefore, in a typical two-level or two-bit MLC programming scheme, the C state corresponds to the highest voltage state and is therefore the most susceptible to data retention charge loss and inadvertent transitions to the next lower voltage state (i.e., C-to-B state transition). FIG. 3 is a graph showing state-to-state transition errors in a solid-state memory device according to one or more embodiments. The graph of FIG. 3 shows a relative sum of bit-flip errors for the various state-to-state transitions across an embodiment of a data storage device. FIG. 3 shows that, in certain embodiments, a substantial portion of bit-flip errors may be caused by C-to-B state transitions, and to a lesser extent by B-to-A transitions. Specifically, in certain embodiments, the C state distribution may move the most to the left and also widen the most to the left among the voltage states during a data retention period. However, if the margin on the low side of the C state is increased, the voltage loss required to push cells across the state transition threshold may be increased, thereby potentially reducing the occurrences of bit errors from data retention charge loss.

As shown in FIG. 3, the B state, as the next highest voltage state, may be the next most susceptible to poor data retention and inadvertent transitions to the next lower voltage state (i.e., B-to-A state transition). Therefore, if the margin on the low side of the B state is increased, the voltage loss required to push cells across the state transition threshold to the A state may be increased, thereby potentially reducing the occurrences of B-to-A bit errors from data retention charge loss. FIG. 3 also shows that the level of bit-flip errors due to other transitions is much lower, and thus those states may benefit less from increased margins.

Figure 4:
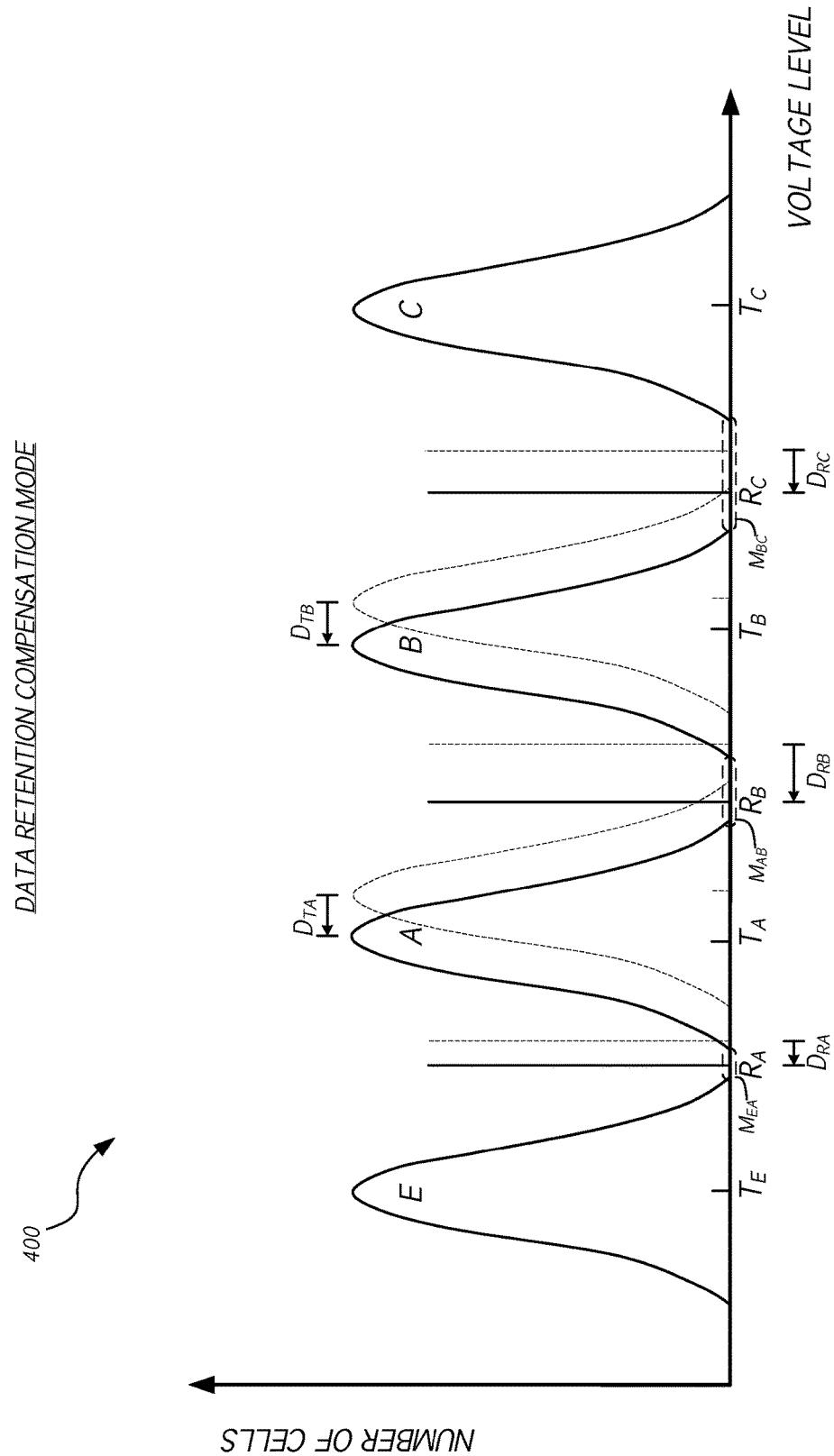
FIG. 4 is a graph showing a probability distribution of cells showing adjusted target programming voltage(s) and/or read threshold level(s) according to one or more embodiments.

FIG. 4 shows an embodiment of a voltage distribution having certain shifted programming target voltage levels and/or read threshold levels to increase the margins below one or more upper voltage states. Similarly to FIG. 2, the diagram of FIG. 4 illustrates an example two-level (two-bit) MLC programming scheme comprising four states, namely an erased state, E, and three programming states A, B and C. The distribution of FIG. 4 shows programming states corresponding to adjusted target programming levels for one or more of the programming states, as well as adjusted voltage read threshold levels for decoding one or more of the states. The various dashed lines in FIG. 4 illustrate the substantially even separation of voltage states shown in FIG. 2 and described above, whereas the solid lines of the diagram represent adjusted target programming levels and/or read threshold levels according to one or more embodiments of a data retention compensation programming mode/scheme, as described herein. In order to favor data retention performance, the distribution 400 provides for moving the A-state program voltage target $T_A$ and B-state program voltage target $T_B$ (possibly to a lesser extent) down in voltage in order to provide more B ($M_{AB}$) and C ($M_{BC}$) state low side margin.

Increasing the margin between, for example, higher-end voltage states may be implemented to compensate for charge loss resulting from data retention. As shown, in the example of FIG. 4, the second-highest voltage state (B) may be programmed using a target voltage $T_B$ that is lower than a default target voltage by an amount $D_{TB}$, which is shown in the diagram. By lowering the target voltage $T_B$ by some amount, the margin $M_{BC}$ between states B and C may be increased. Because the highest number of voltage state transitions may typically occur from state C to state B, the increase in margin between such states may improve data reliability in the presence of potential data retention charge loss. That is, with a larger margin between states B and C, fewer cells may potentially migrate over a read threshold level $R_C$ positioned between the B and C states. In certain embodiments, the read threshold level $R_C$ corresponding to the margin between states B and C may likewise be lowered by some amount $D_{RC}$ in order to position the read threshold level $R_C$ substantially evenly between states B and C within the increased margin $M_{BC}$, or alternatively $R_C$ may be positioned in the region left of center in the margin $M_{BC}$ in order to further reduce occurrences of C-to-B transition errors. In certain embodiments, $R_C$ may be positioned such that the portion of the margin $M_{BC}$ on the low-side of $R_C$ remains at a default range, while the added margin from adjusting the program target voltage $T_B$ is added to the high-side of $R_C$ in the margin $M_{BC}$. In certain embodiments, the target voltage $T_C$ used program state C, or the highest voltage state, may be substantially the same as is implemented in a default programming mode (i.e., no adjustment for data retention compensation). In certain embodiments, only one of read threshold level(s) or program target voltage level(s) is shifted, while the other is not.

In certain embodiments, one or more additional voltage states may be adjusted downward to protect against bit errors caused by data retention charge loss. For example, a target programming voltage $T_A$ used to program the third-highest voltage state (e.g., state A) may be lowered relative to the evenly-separated distribution of FIG. 2. For example, the target programming voltage $T_A$ may be adjusted by an amount $D_{TA}$ lower (i.e., to the left in the diagram of FIG. 4), which may increase a margin $M_{AB}$ between the second-highest voltage state (B) and the third-highest voltage state (A). The voltage read level $R_B$ used to distinguish between states A and B may also be adjusted to the left to position the voltage read level $R_B$ substantially evenly between states A and B, or alternatively $R_B$ may be positioned in the region left of center in the margin $M_{AB}$ in order to further reduce occurrences of B-to-A transition errors. In certain embodiments, $R_B$ may be positioned such that the portion of the margin $M_{AB}$ on the low-side of $R_B$ remains at a default range, while the added margin from adjusting the program target voltage $T_A$ and/or $T_B$ is added to the high-side of $R_B$ in the margin $M_{AB}$. In certain embodiments, the margin $M_{AB}$ between the A and B states may represents a larger margin than would be present in an evenly-distributed voltage distribution, as shown in FIG. 2.

In certain embodiments, the first voltage state (e.g., E state) may represent an erased state, and therefore may not be associated generally with a target programming voltage. However, in certain embodiments, a read threshold level $R_A$ used for distinguishing between the E and A states may also be adjusted in the data retention compensation mode. That is, because the adjustment of the target programming voltage $T_A$ for state A to a lower value may result in a reduced margin $M_{EA}$ between the E and A states, adjustment of the voltage read threshold level $R_A$ between the E and A states may be necessary in order to position the read threshold level $R_A$ substantially evenly between the E and A states. The read threshold level $R_A$ may be adjusted by an amount $D_{RA}$ to the left with respect to the distribution illustrated in FIG. 4. In certain embodiments, $R_A$ may be positioned in the region left of center in the margin $M_{EA}$ in order to further reduce occurrences of A-to-E transition errors.

Figure 5:
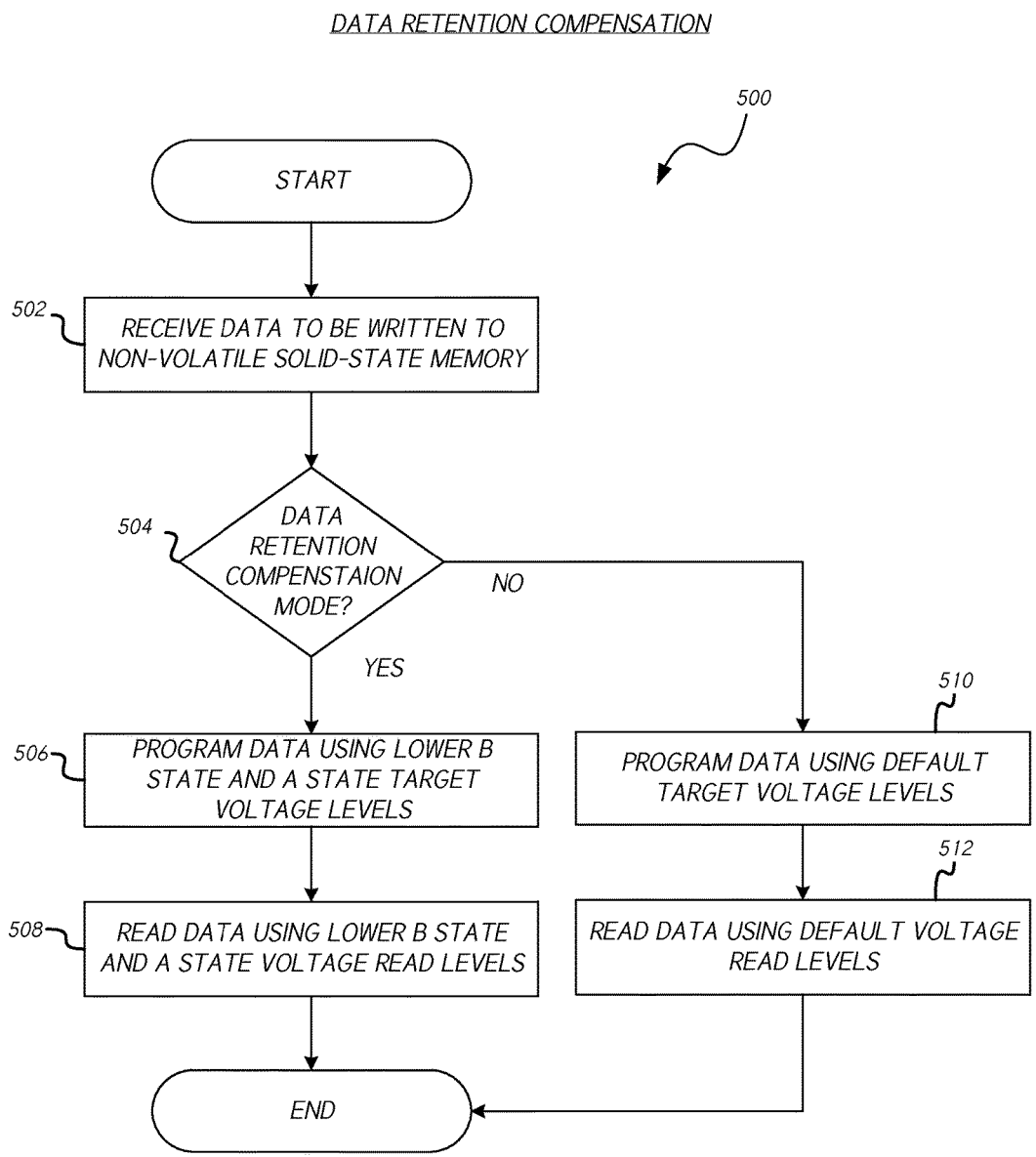
FIG. 5 is a flow diagram illustrating a process for implementing data retention compensation programming according to one or more embodiments.

FIG. 5 illustrates a process 500 for implementing data retention compensation according to one or more embodiments disclosed herein. The process 500 may involve, at block 502, receiving data to be written to non-volatile solid-state memory. A block 504, it may be determined whether or not a data retention compensation mode/scheme is to be implemented in connection with programming of the data received. If not, the process 500 may proceed to block 510, where the data may be programmed to the non-volatile solid-state memory according to one or more default target voltage levels, such as voltage levels similar to those illustrated in FIG. 2 and described above. The process 500 may further involve reading/decoding the data programmed at block 512 using default read voltage threshold levels according to a default decoding scheme.

If the determination block 504 is that a data retention compensation mode/scheme is to be implemented in connection with programming of the received data, the process proceeds to block 506, where the data may be programmed to the non-volatile solid-state memory using one or more lower/adjusted target voltage levels. For example, in certain embodiments, at least a second-highest voltage state (e.g., B state) is programmed using an adjusted target voltage level, such as a target level that has been lowered by some amount relative to the default target voltage level. In addition, in certain embodiments, the data retention compensation programming scheme implemented at block 506 may involve programming data to a third-highest voltage state (e.g., A state) using an adjusted/lower target voltage level. In certain embodiments, the adjustment of the second-highest voltage state (e.g., B state) is greater than the adjustment of the third-highest voltage state (e.g., A state) in order to create a greater margin between the highest and second-highest voltage states than may be present between the second-highest voltage state and the third-highest voltage state. In certain embodiments, the adjustment of the second-highest voltage state (e.g., B state) is greater than the adjustment of the third-highest voltage state (e.g., A state), resulting in a greater margin between the highest and second-highest states than between the second-highest and third-highest states.

At block 508, the process 500 involves reading the programmed data using a lower adjusted read threshold level for the second-highest voltage state (e.g., B state) and a lower adjusted read threshold level for the third-highest voltage state (e.g., A state).

The process 500 may further result in a reduced margin between the erased state and the next highest voltage state (e.g., A state). Therefore, although a reduced margin between the E and A states may be present with respect to data programmed according to the data retention compensation scheme illustrated in FIG. 5, an increased margin between the highest and second-highest voltage states may be present, which may provide protection against state transitions due to data retention charge loss.

In certain embodiments, a command to enable and/or disable the use of the data retention charge loss compensation scheme may be implemented as part of a host interface command protocol associated with a data storage device containing the solid-state memory device (e.g., NAND flash). For example, when the host is aware that prolonged data retention period is likely with respect to certain data, the host may trigger, in the data storage device, the sequence to program/read the data using the adjusted target voltage level(s) and/or read threshold level(s).

In certain embodiments, when a solid-state storage device exceeds a threshold number of writes, the device may be triggered to begin writing/reading using the data retention charge loss compensation scheme described herein. For example, the endurance specification of the device may dictate a maximum number of writes per year; the trigger threshold for the device may be based on such number. In certain embodiments, a number of available blocks in a free pool from which needed blocks are provisioned may also serve as a basis for triggering adjusted target programming voltages and/or read threshold levels. For example, when the free pool is empty, the solid-state storage device could begin using the data retention charge loss compensation scheme.

In certain embodiments, the use of the data retention charge loss compensation scheme may be used by the data storage device to program data into non-volatile solid-state memory on the last cycle before the memory enters a long data retention period when data is not expected to be overwritten, or in connection with graceful power-down of the memory. The storage device (e.g., device firmware) may detect the last P/E cycle and program the data to the solid-state memory using the adjusted target programming level(s) on the last program operation for each page.

Read Disturb Compensation

Read disturb may occur when a solid-state memory cell is read. For example, the select voltage applied to read the cell may have a slight charging effect on the cell. After many read operations, the charge stored in the cell may therefore be elevated due to the read operations such that the cell transitions to the next higher voltage state. For example, read disturb may result in undesired E-to-A state transitions. This effect may be particularly pronounced when the starting state of the cell is the erase state (E), which generally is the lowest voltage state. If a greater margin is provided on the high side of the E state, the voltage gain required to push the cell across the read threshold transition may be increased, thereby at least partially reducing the probability of producing an unwanted state change.

Figure 6:
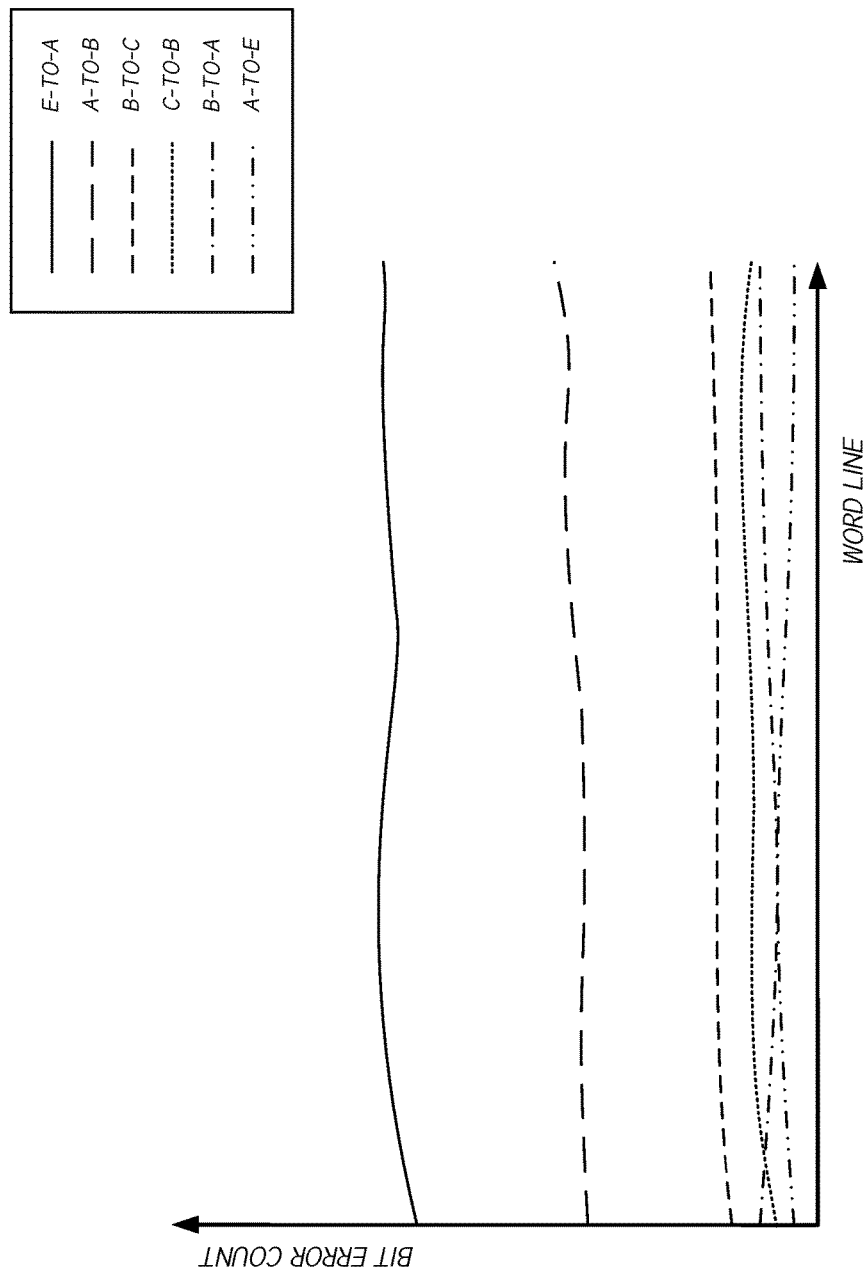
FIG. 6 is a graph showing state-to-state transition errors in a solid-state memory device due to read disturb according to one or more embodiments.

FIG. 6 is a graph showing state-to-state transition errors in a solid-state memory device according to one or more embodiments. The graph of FIG. 6 shows a relative sum of bit-flip errors for the various state-to-state transitions across an embodiment of a data storage device. As is demonstrated in FIG. 6, in an example two-bit MLC programming scheme, the E-to-A state transition may represent the most prevalent bit-flip error caused by read disturb. This may be due at least in part to the relatively lower voltage present on such cells. In certain embodiments, E-to-A transition errors may constitute a majority or plurality of bit-flip errors with respect to read disturb charge gain, followed possibly by A-to-B errors.

Figure 7:
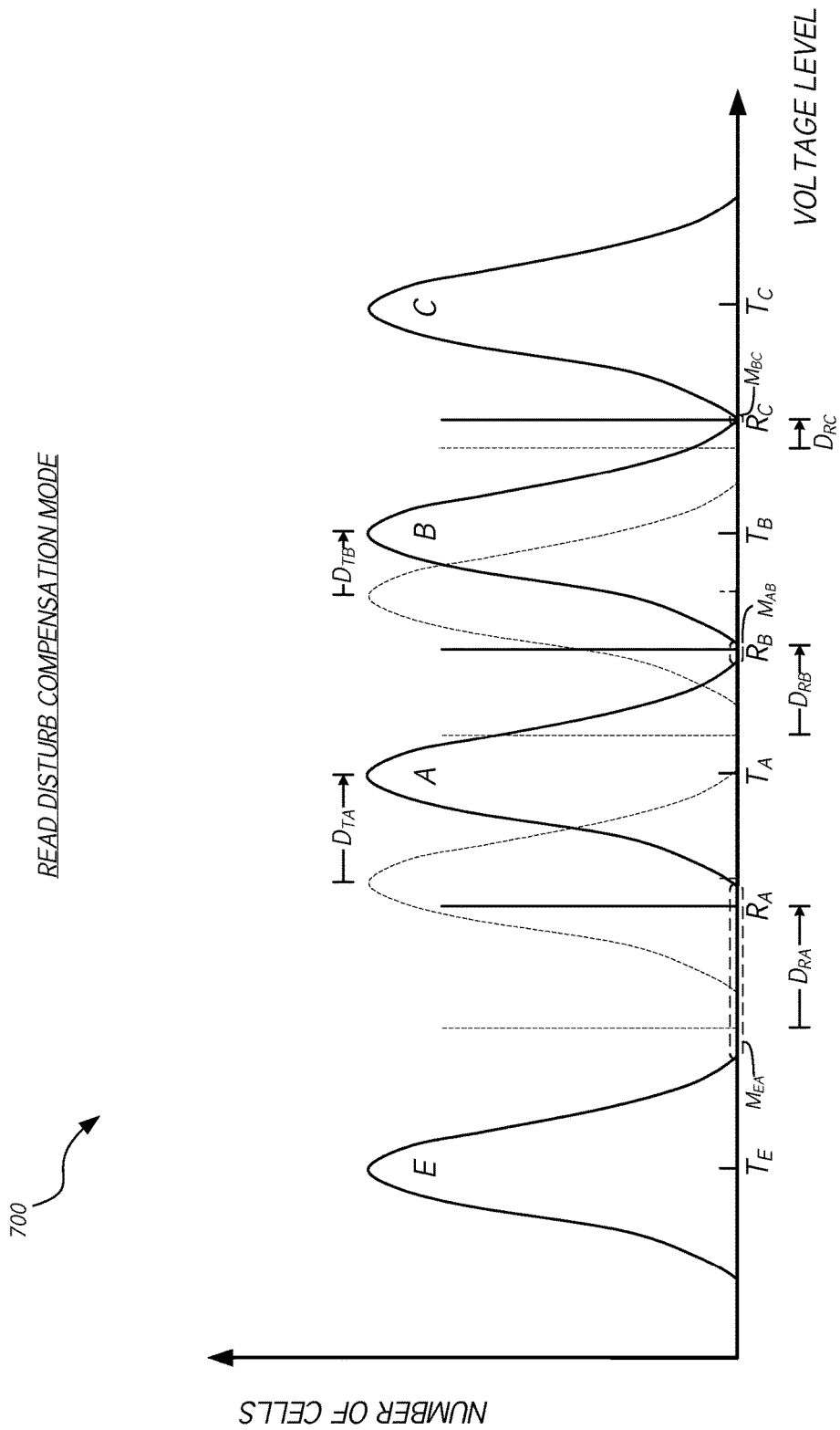
FIG. 7 is a graph showing a probability distribution of cells showing adjusted target programming voltage(s) and/or read threshold level(s) according to one or more embodiments.

In order to favor read disturb performance, certain embodiments disclosed herein provide a method for moving the A, B and/or C program voltage targets up in voltage in order to provide more E state high-side margin (i.e., margin between the E and A states). FIG. 7 is a graph showing a probability distribution of cells showing adjusted target programming voltage(s) and/or read threshold level(s) according to one or more embodiments. Because, as described above, the greatest occurrence of state transitions due to read disturb charge gain may involve cells program to a erased state (E) migrating across a voltage read level boundary positioned between the erased and next highest voltage state, it may be desirable to increase the margin between the E state and the next highest voltage state (e.g., A state). Therefore, in certain embodiments, one or more voltage states may be adjusted to a higher voltage target levels in order to increase the margin between the E and A states for the purpose of implementing read disturb compensation programming according to one or more embodiments disclosed herein.

The distribution 700 provides an example distribution associated with read disturb compensation as described herein. The distribution 700 shows solid-line voltage states, which correspond to a read disturb compensation programming/reading scheme, as well as dashed-line voltage states and read threshold levels, which may correspond to a default programming/reading scheme providing substantially-evenly separated voltage states, such as is shown in FIG. 2 and described above. The distribution 700 may include an adjusted A state, which is programmed using a target programming voltage $T_A$ that is adjusted with respect to a default programming voltage associated with the a state by an amount $D_{TA}$ that is higher than the default target voltage. Such adjustment may increase the margin $M_{EA}$ between the E and A states, possibly substantially. In certain embodiments, the distribution 700 comprises a margin $M_{EA}$ between the E and A state that is greater than the margins between the A and B states and/or the B and C states. In order to reduce the occurrences of transitions of cells across the read threshold boundary between the E and A states, the read threshold level used to distinguish between the E and A states may be adjusted to a higher level (i.e., to the right in the illustration of FIG. 5). For example, the read threshold level $R_A$ may be adjusted by an amount $D_{RA}$ relative to a default read threshold level. In certain embodiments, $R_A$ may be positioned in the region right of center in the margin $M_{EA}$ in order to further reduce occurrences of E-to-A transition errors. For example, $R_A$ may be positioned such that the portion of the margin $M_{EA}$ on the high-side of $R_A$ remains at a default range, while the added margin from adjusting the program target voltage $T_A$ is added to the low-side of $R_A$ in the margin $M_{EA}$.

In certain embodiments, one or more additional voltage states may be adjusted upward to provide read disturb compensation. For example, the third-highest voltage level (B) may be programmed using a target voltage $T_B$ that is greater by an amount $D_{TB}$ than a default target voltage level associated with the B state. Furthermore, in order to account for the adjustment of the B and/or A states to the right, the read threshold level $R_B$ used to distinguish between the A and B states may likewise need to be adjusted by some amount $D_{RB}$ to the right in order to be positioned substantially evenly between the A and B states within the margin $M_{AB}$ between the states; alternatively, $R_B$ may be positioned in the region right of center in the margin $M_{AB}$ in order to further reduce occurrences of A-to-B transition errors. In certain embodiments, $R_B$ may be positioned such that the portion of the margin $M_{AB}$ on the high-side of $R_B$ remains at a default range, while the added margin from adjusting the program target voltage(s) $T_A$ and/or $T_B$ is added to the low-side of $R_B$ in the margin $M_{AB}$. In certain embodiments, the program voltage target levels for the A, B and C states may be adjusted up together in order to increase the E state high-side margin. In certain embodiments, only read threshold level(s) are adjusted to achieve E state high-side margin. For example, the read threshold level between the E and A states, $R_A$, may be adjusted to the right, while the programming target voltage level $T_A$ may remain at a default position.

As a result of the adjustment of the A and/or B states to the right, the distribution 700 may be associated with a read threshold level $R_C$ between the B and C states that is likewise adjusted by some amount $D_{RC}$ to the right in order to position the read threshold level $R_C$ substantially evenly between the B and C states with in the margin $M_{BC}$ that separates such states; alternatively, $R_C$ may be positioned in the region right of center in the margin $M_{BC}$ in order to further reduce occurrences of B-to-C transition errors. In certain embodiments, $R_C$ may be positioned such that the portion of the margin $M_{BC}$ on the high-side of $R_C$ remains at a default range, while the added margin from adjusting the program target voltages $T_A$ and/or $T_B$ is added to the low-side of $R_C$ in the margin $M_{BC}$. In certain embodiments, neither the lowest voltage state nor the highest voltage state is substantially adjusted or modified with respect to the associated default programming scheme.

Figure 8:
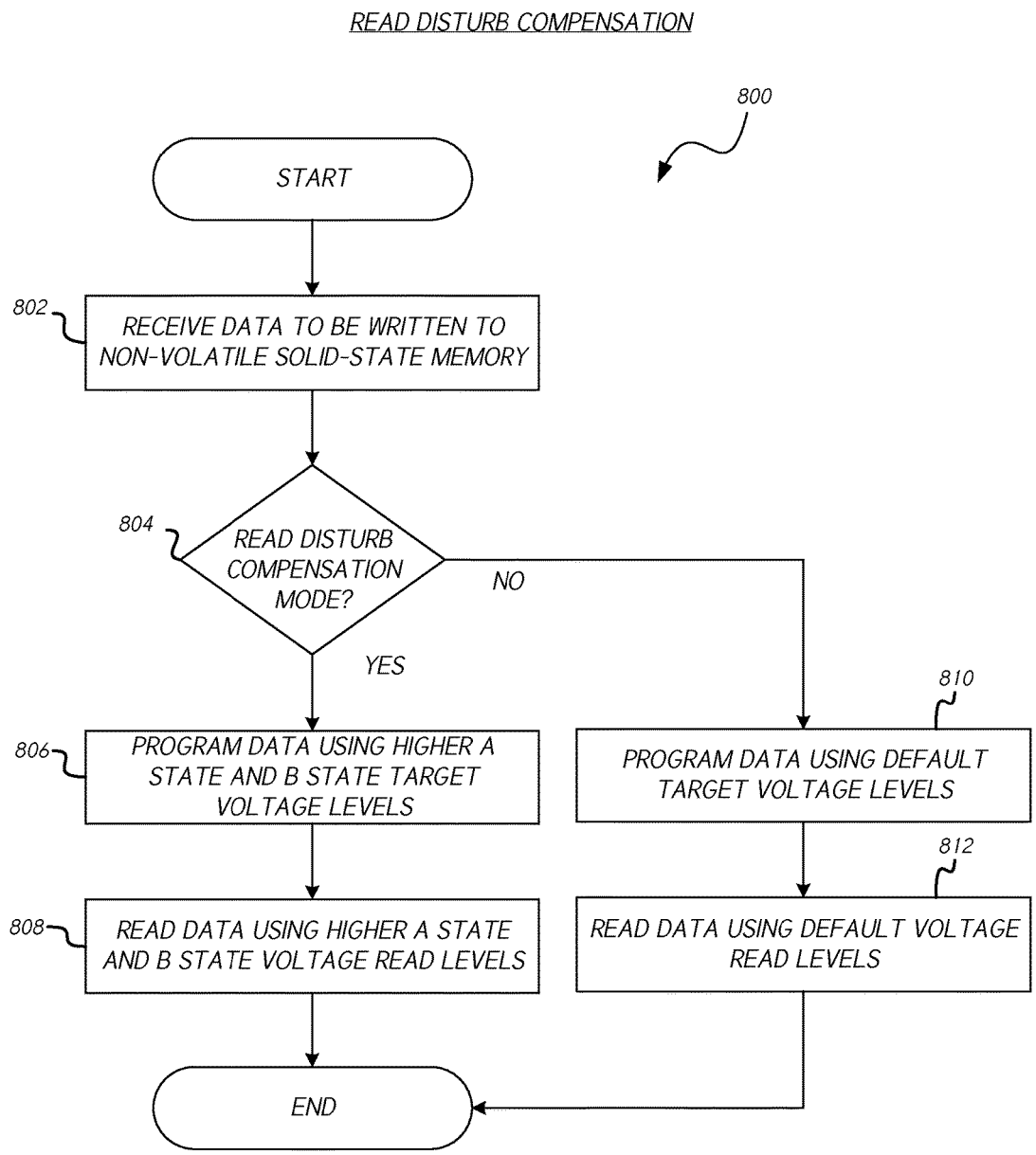
FIG. 8 is a flow diagram illustrating a process for implementing read disturb compensation programming according to one or more embodiments.

FIG. 8 is a flow diagram illustrating a read disturb compensation programming mode according to one or more embodiments. The process 800 may involve, at block 802, receiving data to be written to non-volatile solid-state memory. A block 804, it may be determined whether or not a read disturb compensation mode/scheme is to be implemented in connection with programming of the data received. If not, the process 800 may proceed to block 810, where the data may be programmed to the non-volatile solid-state memory according to one or more default target voltage levels, such as voltage levels similar to those illustrated in FIG. 2 and described above. The process 800 may further involve reading/decoding the data programmed at block 812 using default read voltage threshold levels according to a default decoding scheme.

If the determination block 804 is that a read disturb compensation mode/scheme is to be implemented in connection with programming of the received data, the process proceeds to block 806, where the data may be programmed to the non-volatile solid-state memory using one or more higher/adjusted target voltage levels. For example, in certain embodiments, at least a second-lowest voltage state is programmed using an adjusted target voltage level, such as a target level that has been raised by some amount relative to the default target voltage level. What about read threshold adj.

In addition, in certain embodiments, the read disturb compensation programming scheme implemented at block 806 may involve programming data to a third-lowest voltage state (e.g., B state) using an adjusted/higher target voltage level. In certain embodiments, the adjustment of the second-lowest voltage state (e.g., A state) is greater than the adjustment of the third-lowest voltage state (e.g., B state) in order to create a greater margin between the lowest (e.g., E state) and second-lowest voltage (e.g., A state) states than may be present between the second-lowest voltage state (e.g., A state) and the third-lowest voltage state (e.g., B state). In certain embodiments, the adjustment of the third-lowest voltage state (e.g., B state) is greater than the adjustment of the second-lowest voltage state (e.g., A state), though a greater margin may still result between the lowest and second-lowest states than between the second-lowest and third-lowest states (see, e.g., FIG. 7). In certain embodiments, the amount $D_{TA}$ of adjustment of the programming target voltage for the second-lowest voltage state (e.g., A state) and the amount $D_{TB}$ of the adjustment of the programming target voltage of the third-lowest voltage state (e.g., B state) are approximately the same.

The process 800 may further result in a reduced margin between the highest voltage state (e.g., C state) and the next lowest voltage state (e.g., B state). Therefore, although a reduced margin between the C and B states may be present with respect to data programmed according to the read disturb compensation scheme illustrated in FIG. 8, an increased margin between the lowest (e.g., E state) and second-lowest voltage (e.g., A state) states may be present, which may provide protection against state transitions due to read disturb.

In certain embodiments, a command to enable and/or disable the use of the read disturb compensation scheme may be implemented as part of a host interface command protocol associated with the solid-state memory device (e.g., NAND flash). For example, when the host is aware that repetitive reads are likely with respect to certain data, the host may trigger, in the data storage device, the sequence to program/read the data using the adjusted target voltage level(s) and/or read threshold level(s).

In certain embodiments, when a solid-state storage device exceeds a threshold number of writes, the device may be triggered to begin writing/reading using the read disturb compensation scheme described herein. For example, the endurance specification of the device may dictate a maximum number of writes per year; the trigger threshold for the device may be based on such number. In certain embodiments, a number of available blocks in a free pool from which needed blocks are provisioned may also serve as a basis for triggering adjusted target programming voltages and/or read threshold levels. For example, when the free pool is empty, the solid-state storage device could begin using the read disturb compensation scheme.

Combined Data Retention and Read Disturb Compensation

If both read disturb and data retention performance are desired to be improved, both the margin on the high side of the E state and the margin on the low side of the C state may be increased in order to gain benefits associated with both compensation schemes described above. For example, in order to favor both read disturb performance and data retention performance, certain embodiments disclosed herein provide a method for moving the A program voltage target up in voltage in order to provide more E state high-side margin (i.e., margin between the E and A states), wherein the B program voltage target level is further adjusted down in voltage in order to provide more C state low-side margin (i.e., margin between the B and C states).

Figure 9:
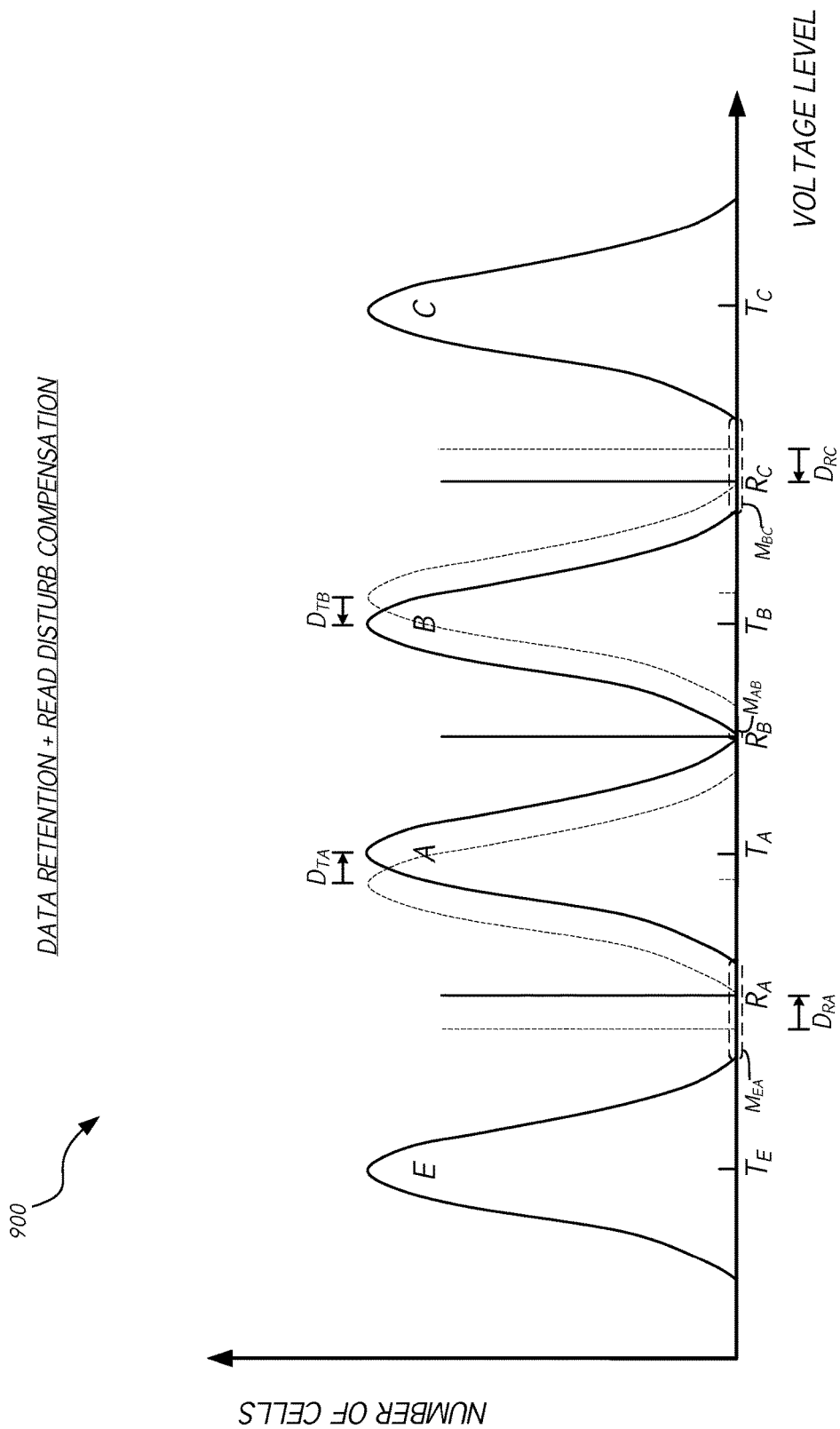
FIG. 9 is a graph showing a probability distribution of cells showing adjusted target programming voltage(s) and/or read threshold level(s) according to one or more embodiments.

FIG. 9 is a graph showing a probability distribution of cells showing adjusted target programming voltage(s) and/or read threshold level(s) according to one or more embodiments. FIG. 9 illustrates a distribution 900 that includes relatively increased margins between the lowest and second-lowest voltage states, as well as between the highest and second-highest voltage states. For example, with respect to an example two-level (two-bit) MLC programming scheme, the distribution 900 may include increased margins between the E and A states, as well as between the B and C states. With increased read margins between the E and A states and the C and B states, the distribution 900 may provide protection against both read disturb errors resulting from transitions of program cells from the E state to the A state, as well as errors resulting from charge loss causing transition from the C state to the B state. As a trade-off, the margin $M_{AB}$ between the A and B states, or one or more additional intermediate margins of the distribution 900, may be reduced with respect to a default programming scheme in which voltage states are substantially evenly separated.

To implement the data retention and read disturb compensation scheme illustrated in FIG. 9, the distribution may include a second-highest distribution state programmed using a target voltage that is less than a default target voltage generally associated with such state. For example, as illustrated, the adjusted target level $T_B$ may be higher than the default target level by an amount $D_{TB}$, wherein the various dashed lines of the illustration represent default voltage states and/or read threshold levels. The read threshold level $R_C$ used to distinguish between the C and B states may likewise be adjusted to the left in order to position the read threshold level $R_C$ substantially evenly between the C and B states within the enlarged margin $M_{BC}$.

The distribution 900 further provides an enlarged margin $M_{EA}$ between the lowest voltage state and the second-lowest voltage state relative to the default voltage distribution scheme comprising substantially evenly separated programming states. In order to achieve the larger margin $M_{EA}$ between the E and A states, the target voltage level $T_A$ used to program the A state when in the data retention and read disturb compensation programming mode may be adjusted (i.e., to the right with respect to the diagram FIG. 9), to thereby increase the distance between the lowest voltage state and the second-lowest voltage state. The read threshold level $R_A$ used to distinguish between the lowest voltage state and the second-lowest voltage state may likewise be adjusted by an amount $D_{RA}$ upward in order to position the read level $R_A$ substantially evenly between the two states within the margin $M_{EA}$, or to the right-of-center in the margin $M_{EA}$. The target voltage $T_A$ may be adjusted upward by an amount $D_{TA}$, as illustrated in the diagram in FIG. 9.

With increased margins between the lowest and second lowest voltage states and between the highest and second-highest voltage states, the distribution 900 may result in reduced margins between intermediate voltage states (e.g., between states A and B) in embodiments in which the erased state and/or highest voltage states are not substantially adjusted with respect to target voltage levels. For example, the margin $M_{AB}$ between states A and B in the distribution 900 may be smaller than the margin between states A and B for a default evenly-separated distribution. In certain embodiments, the read threshold level(s) between the intermediate states may not need to be adjusted. For example, with respect to a four-state programming scheme, with substantially equal adjustment to the margin between states E and A states and the margin between states B and C, the read threshold level $R_B$ may remain substantially evenly positioned between states A and B without adjustment. In embodiments in which either of the margins $M_{EA}$, $M_{BC}$ is greater than the other, it may be necessary or desirable to adjust the voltage read level $R_B$ between the A and B states to compensate for the disproportionate margins between the E and A states and the B and C states.

Figure 10:
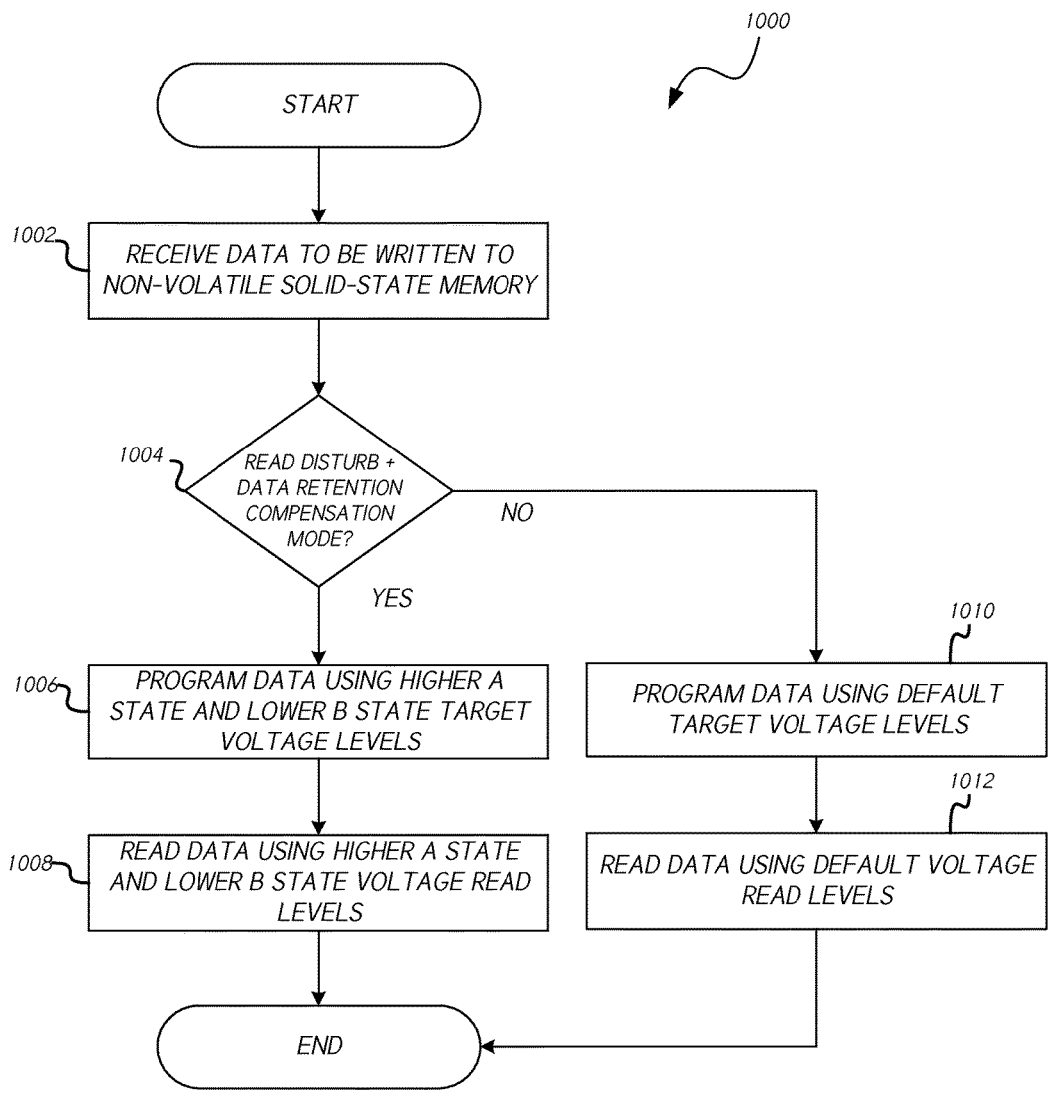
FIG. 10 is a flow diagram illustrating a process for implementing data retention and read disturb compensation programming according to one or more embodiments.

FIG. 10 is a flow diagram illustrating a data retention and read disturb compensation programming process according to one or more embodiments. The process 1000 may involve, at block 1002, receiving data to be written to non-volatile solid-state memory. At block 1004, it may be determined whether or not a data retention and read disturb compensation mode/scheme is to be implemented in connection with programming of the data received. If not, the process 1000 may proceed to block 1010, where the data may be programmed to the non-volatile solid-state memory according to one or more default target voltage levels, such as voltage levels similar to those illustrated in FIG. 2 and described above. The process 1000 may further involve reading/decoding the data programmed at block 1012 using default read voltage threshold levels according to a default decoding scheme.

If the determination block 1004 is that a data retention and read disturb compensation mode/scheme is to be implemented in connection with programming of the received data, the process proceeds to block 1006, where the data may be programmed to the non-volatile solid-state memory using one or more adjusted target voltage levels. For example, in certain embodiments, at least a second-lowest voltage state (e.g., A state) is programmed using an adjusted target voltage level, such as a target level that has been raised by some amount relative to the default target voltage level, and a second-highest voltage state (e.g., B state) is programmed using an adjusted target voltage level that has been lowered by some amount relative to the default target voltage level. The process proceeds to block 1008 where data is read back using adjusted voltage thresholds.

The process 1000 may further result in a reduced margin between the second highest voltage state (e.g., B state) and the next lowest voltage state (e.g., A state). Therefore, although a reduced margin between the A and B states may be present with respect to data programmed according to the data retention and read disturb compensation scheme illustrated in FIG. 10, an increased margin between the lowest and second-lowest voltage states and between the highest and second-highest voltage states may be present, which may provide protection against state transitions due to data retention charge loss and read disturb.

In certain embodiments, a command to enable and/or disable the use of the data retention and read disturb compensation scheme may be implemented as part of a host interface command protocol associated with the solid-state memory device (e.g., NAND flash). For example, when the host is aware that repetitive reads are likely with respect to certain data, the host may trigger, in the data storage device, the sequence to program/read the data using the adjusted target voltage level(s) and/or read threshold level(s).

ADDITIONAL EMBODIMENTS

Those skilled in the art will appreciate that in some embodiments, other types of solid-state encoding/decoding systems can be implemented while remaining within the scope of the present disclosure. In addition, the actual steps taken in the processes discussed herein may differ from those described or shown in the figures. Depending on the embodiment, certain of the steps described above may be removed, and/or others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, application-specific integrated circuit (ASIC), field-programmable gate array (FPGA), or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

All of the processes described above may be embodied in, and fully automated via, software code modules executed by one or more general purpose or special purpose computers or processors. The code modules may be stored on any type of computer-readable medium or other computer storage device or collection of storage devices. Some or all of the methods may alternatively be embodied in specialized computer hardware.

What is claimed is:

1. A data storage device comprising:
   a solid-state non-volatile memory including memory cells; and
   a controller configured to:
     perform a first programming scheme that at least:
       programs a first subset of the memory cells to a first voltage state associated with a first target voltage;
       programs a second subset of the memory cells to a second voltage state associated with a second target voltage higher than the first target voltage;
       programs a third subset of the memory cells to a third voltage state associated with a third target voltage higher than the second target voltage; and
       programs a fourth subset of the memory cells to a fourth voltage state associated with a fourth target voltage higher than the third target voltage;
     wherein a difference in voltage between the fourth target voltage and the third target voltage is greater than at least one of:
       a difference in voltage between the third target voltage and the second target voltage; and
       a difference in voltage between the second target voltage and the first target voltage.

2. The data storage device of claim 1, wherein said programming the first, second, third and fourth subsets reduces occurrences of cells of the fourth subset of the memory cells from migrating from the fourth voltage state to the third voltage state during a data retention period.

3. The data storage device of claim 1, wherein the first voltage state corresponds to an erase state, wherein said programming the first subset of the memory cells comprises maintaining the first subset of the memory cells in the erase state.

4. The data storage device of claim 1, wherein:
the difference in voltage between the fourth target voltage and the third target voltage is greater than the difference in voltage between the third target voltage and the second target voltage; and
the difference in voltage between the third target voltage and the second target voltage is greater than the difference in voltage between the second target voltage and the first target voltage.

5. The data storage device of claim 1, wherein the controller is further configured to:
decode one or more of the second subset of the memory cells using a first voltage read level between the first target voltage and the second target voltage;
decode one or more of the third subset of the memory cells using a second voltage read level between the second target voltage and the third target voltage; and
decode one or more of the fourth subset of the memory cells using a third voltage read level between the third target voltage and the fourth target voltage;
wherein a difference in voltage between the third voltage read level and the second voltage read level is greater than a difference in voltage between the second voltage read level and the first voltage read level.

6. The data storage device of claim 1, wherein the controller is further configured to perform the first programming scheme when a data retention mode is set.

7. The data storage device of claim 1, wherein the controller is further configured to:
perform a second programming scheme when a data retention mode is not set;
wherein in the second programming scheme, the difference in voltage between the fourth target voltage and the third target voltage is not greater than:
the difference in voltage between the third target voltage and the second target voltage; and
the difference in voltage between the second target voltage and the first target voltage.

8. A data storage device comprising:
a solid-state non-volatile memory including memory cells; and
a controller configured to:
perform a first programming scheme that at least:
programs a first subset of the memory cells to a first voltage state associated with a first target voltage;
programs a second subset of the memory cells to a second voltage state associated with a second target voltage higher than the first target voltage;
programs a third subset of the memory cells to a third voltage state associated with a third target voltage higher than the second target voltage; and
programs a fourth subset of the memory cells to a fourth voltage state associated with a fourth target voltage higher than the third target voltage;
wherein a difference in voltage between the first target voltage and the second target voltage is greater than at least one of:
a difference in voltage between the second target voltage and the third target voltage; and
a difference in voltage between the third target voltage and the fourth target voltage.

9. The data storage device of claim 8, wherein said programming the first, second, third and fourth subsets reduces occurrences of cells of the first subset of the memory cells from migrating from the first voltage state to the second voltage state in response to read disturb charge gain.

10. The data storage device of claim 8, wherein:
the difference in voltage between the first target voltage and the second target voltage is greater than the difference in voltage between the second target voltage and the third target voltage; and
the difference in voltage between the second target voltage and the third target voltage is greater than the difference in voltage between the third target voltage and the fourth target voltage.

11. The data storage device of claim 8, wherein the controller is further configured to:
decode one or more of the second subset of the memory cells using a first voltage read level between the first target voltage and the second target voltage;
decode one or more of the third subset of the memory cells using a second voltage read level between the second target voltage and the third target voltage; and
decode one or more of the fourth subset of the memory cells using a third voltage read level between the third target voltage and the fourth target voltage;
wherein a difference in voltage between the first voltage read level and the second voltage read level is greater than a difference in voltage between the second voltage read level and the third voltage read level.

12. The data storage device of claim 8, wherein the difference in voltage between the first target voltage and the second target voltage and the difference in voltage between the third target voltage and the fourth target voltage are both greater than a difference in voltage between the second target voltage and the third target voltage.

13. The data storage device of claim 12, wherein the difference in voltage between the fourth target voltage and the third target voltage is substantially the same as the difference in voltage between the second target voltage and the first target voltage.

14. The data storage device of claim 8, wherein the controller is further configured to perform the first programming scheme when a read disturb compensation mode is set.

15. The data storage device of claim 8, wherein the controller is further configured to:
perform a second programming scheme when a read disturb compensation mode is not set;
wherein in the second programming scheme, the difference in voltage between the first target voltage and the second target voltage is not greater than:
the difference in voltage between the second target voltage and the third target voltage; and
the difference in voltage between the third target voltage and the fourth target voltage.

16. A method of programming data in a solid-state non-volatile memory, the method comprising:
receiving data to be written to a solid-state non-volatile memory including memory cells;
determining whether a data retention programming mode associated with the solid-state non-volatile memory is set; and
when a data retention mode is not set:
programming a first subset of the memory cells to a first voltage state associated with a first target voltage;
programming a second subset of the memory cells to a second voltage state associated with a second target voltage higher than the first target voltage;
programming a third subset of the memory cells to a third voltage state associated with a third target voltage higher than the second target voltage; and programming a fourth subset of the memory cells to a fourth voltage state associated with a fourth target voltage higher than the third target voltage; and when the data retention mode is set:
programming a fifth subset of the memory cells to an adjusted third voltage state associated with an adjusted third target voltage that is lower than the third target voltage.

17. The method of claim 16, further comprising, when the data retention mode is set, programming a sixth subset of the memory cells to an adjusted second voltage state associated with an adjusted second target voltage that is lower than the third target voltage.

18. A method of programming data in a solid-state non-volatile memory, the method comprising:

receiving data to be written to a solid-state non-volatile memory including memory cells;

determining whether a read disturb programming mode associated with the solid-state non-volatile memory is set; and when a read disturb compensation mode is not set:
programming a first subset of the memory cells to a first voltage state associated with a first target voltage;
programming a second subset of the memory cells to a second voltage state using a second target voltage higher than the first target voltage;
programming a third subset of the memory cells to a third voltage state associated with a third target voltage higher than the second target voltage; and
programming a fourth subset of the memory cells to a fourth voltage state associated with a fourth target voltage higher than the third target voltage; and when the read disturb compensation mode is set:
programming a fifth subset of the memory cells to an adjusted second voltage state associated with an adjusted second target voltage that is higher than the second target voltage.

19. The method of claim 18, further comprising, when the read disturb mode is set, programming a sixth subset of the memory cells to an adjusted third voltage state associated with an adjusted third target voltage that is higher than the third target voltage.

20. A data storage device comprising:
a solid-state non-volatile memory including memory cells; and
a controller configured to:
program a first subset of the memory cells to a first voltage state associated with a first target voltage;
program a second subset of the memory cells to a second voltage state associated with a second target voltage higher than the first target voltage;
program a third subset of the memory cells to a third voltage state associated with a third target voltage higher than the second target voltage; and
program a fourth subset of the memory cells to a fourth voltage state associated with a fourth target voltage higher than the third target voltage;
wherein at least one of a difference in voltage between the fourth target voltage and the third target voltage and a difference in voltage between the third target voltage and the second target voltage is different than a difference in voltage between the second target voltage and the first target voltage.

21. The data storage device of claim 20, wherein the controller is further configured to:
decode one or more of the second subset of the memory cells using a first voltage read level between the first target voltage and the second target voltage;
decode one or more of the third subset of the memory cells using a second voltage read level between the second target voltage and the third target voltage; and
decode one or more of the fourth subset of the memory cells using a third voltage read level between the third target voltage and the fourth target voltage;
wherein a difference in voltage between the third voltage read level and the second voltage read level is different than a difference in voltage between the second voltage read level and the first voltage read level.

* * * * *